(12) United States Patent
Orlowski (10) Patent No.: US 8,377,793 B2
(45) Date of Patent: Feb. 19, 2013

(54) METHOD FOR MANUFACTURING A NON-VOLATILE MEMORY, NON-VOLATILE MEMORY DEVICE, AND AN INTEGRATED CIRCUIT

(75) Inventor: Marius Orlowski, Meylan (FR)

(73) Assignee: Freescale Semiconductor, Inc., Austin, TX (US)

( * ) Notice: Subject to any disclaimer, the term of this patent is extended or adjusted under 35 U.S.C. 154(b) by 369 days.

(21) Appl. No.: 12/738,409

(22) PCT Filed: Oct. 23, 2007

(86) PCT No.: PCT/IB2007/055378
§ 371 (c)(1),
(2), (4) Date: Apr. 16, 2010

(87) PCT Pub. No.: WO2009/053779
PCT Pub. Date: Apr. 30, 2009

(65) Prior Publication Data
US 2010/0219459 A1    Sep. 2, 2010

(51) Int. Cl.
*H01L 21/764* (2006.01)
*H01L 29/788* (2006.01)
(52) U.S. Cl. ........ 438/421; 438/211; 438/257; 438/593; 257/319; 257/411; 257/421
(58) Field of Classification Search .................. None
See application file for complete search history.

(56) References Cited

U.S. PATENT DOCUMENTS

| 6,011,725 | A | 1/2000 | Eitan |
| 6,639,271 | B1 | 10/2003 | Zheng et al. |
| 6,706,599 | B1 | 3/2004 | Sadd et al. |
| 2005/0104117 | A1 | 5/2005 | Mikolajick et al. |
| 2005/0236613 | A1 | 10/2005 | Shih et al. |
| 2006/0001075 | A1 | 1/2006 | Shih |
| 2006/0134871 | A1 | 6/2006 | Jakschik et al. |
| 2007/0210338 | A1 | 9/2007 | Orlowski |
| 2009/0121273 | A1* | 5/2009 | King et al. ............ 257/316 |

FOREIGN PATENT DOCUMENTS

WO    03/067640 A    8/2003

OTHER PUBLICATIONS

Krivokapic Z et al: "Quantum-Well Memory Device (QWMD) With Extremely Good Charge Retention" International Electron Devices Meeting, 2002, IEDM, Technical Digest, San Francisco, CA, Dec. 8-11, 2002, pp. 185-188.
Boeuf F et al: "16nm Planar NMOSFET Manufacturable Within State-of-the-Art CMOS Process Thanks to Specific Design and Optimisation" IEEE, 2001 IEDM Technology Digest 2001, pp. 29.5.1-29.5.4.
Monfray S et al: "50nm—Gate All Around (GAA)—Silicon on Nothing (SON)—Devices: A Simple Way to Co-Integration of GAA Transistors Within Bulk MOSFET Process" IEEE, 2002, VLSI Technology Symposium 2002, p. 108.
International Search Report and Written Opinion Correlating to PCT/IB2007/055378 dated Aug. 1, 2008.

* cited by examiner

*Primary Examiner* — Zandra Smith
*Assistant Examiner* — Pamela E Perkins (57) ABSTRACT

A method of manufacturing a non-volatile memory device, including providing at least one control gate layer on a substrate. A passage may be created between the at least one control gate layer and the substrate. In the passage at least one filling layer may be provided. A floating gate structure including the filling layer may be formed, as well as a control gate structure including the at least one control gate layer, the control gate structure being in a stacked configuration with the floating gate structure.

20 Claims, 6 Drawing Sheets

METHOD FOR MANUFACTURING A NON-VOLATILE MEMORY, NON-VOLATILE MEMORY DEVICE, AND AN INTEGRATED CIRCUIT

FIELD OF THE INVENTION

This invention relates to a method for manufacturing a non-volatile memory, to a non-volatile memory device, and to an integrated circuit.

BACKGROUND OF THE INVENTION

Non-volatile memory, such as electrically erasable programmable read only memory (EEPROM) or flash memory, typically includes an arrangement of floating gate field effect transistors (FG-FET). The FG-FET includes a floating gate which is electrically isolated, creating a floating node, but which is capacitively connected to the channel of the field effect transistor. The FG-FET further has a control gate in a stacked arrangement with the floating gate. The control gate is positioned above the floating gate and is electrically isolated from the floating gate, but in capacitive contact with the floating gate. The charge in the floating gate, and hence the voltage thereof can be controlled by means of the control gate.

The arrangement of FG-FET is typically manufactured by providing a polycrystalline or amorphous dielectric layer on a crystalline substrate and depositing a floating gate layer of polycrystalline silicon on the dielectric layer. On the floating gate layer a control gate layer is deposited after a second dielectric layer is deposited, which separates the floating gate layer and the control gate layer. Typically, in conventional technology a dielectric layer of $SiO_2$ or a tri-layer of $SiO_2/Si_3N_4/SiO_2$ (so called oxide-nitride-oxide or ONO layer) is deposited in order to obtain a high quality dielectric between the floating and the control gate.

However, a disadvantage of this process is that the characteristics of the floating gate layer, the second dielectric layer and the control gate layer cannot be controlled as accurately as would be desirable because they are deposited on a polycrystalline or amorphous layer. For example, the deposited dielectric layers have a relatively high density of defects and charge carrier traps both in the bulk of the dielectric material and at the interfaces. These defective sites might capture electrons, holes or even ionic contaminants that would distort the operation of the memory cell or make the distinction in reading between stored values very difficult if not impossible. Also,

SUMMARY OF THE INVENTION

The present invention provides relates a method for manufacturing a non-volatile memory, a non-volatile memory device, and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Referring to FIG. 1, a first example of a method of manufacturing a non-volatile memory device is illustrated therein. In the shown example, a non-volatile memory 100, for example flash memory or Electrically Erasable Programmable Read Only Memory (EEPROM), is formed on a substrate 1.

Figure 1A:
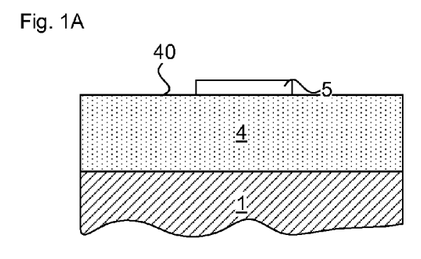
FIGS. 1A-E schematically shows cross-sectional views of a non-volatile memory device in different stages of a first example of a method of manufacturing a non-volatile memory device.

As illustrated in FIG. 1A, for example, one or more control gate layers 4 may be provided on one or more layers of a substrate 1. In the shown example, the substrate 1 is a monocrystalline, monolayer substrate 1. However, the substrate 1 may alternatively include two or more layers and/or be polycrystalline or be amorphous.

The control gate layer 4 may be made of any suitable material, such as polycrystalline silicon, from hereon referred to as polysilicon, mono-crystalline silicon or a metal, and be provided using any suitable technique, for example by (vapour) deposition. The control gate layer 4 may be provided directly on the substrate 1. Alternatively, the control gate layer 4 may be deposited on top intermediate layers present between the control gate layers 4 and the substrate 1, as e.g. explained below with reference to FIGS. 2 and 4. The control gate layer 4 may for example be a mono-crystalline grown on top of an epitaxial sacrificial layer such as SiGe on a silicon substrate.

Figure 1B:
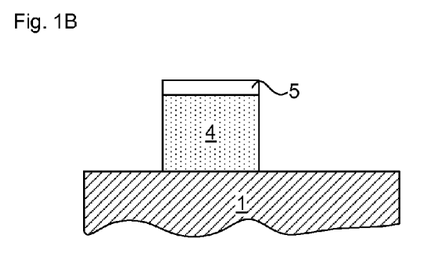
Figure 1C:
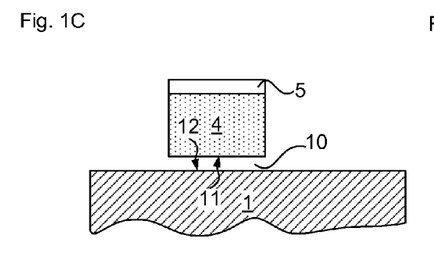

As shown in FIG. 1C, a space 10 may be provided between the control gate layers 4 and the substrate 1. In this respect, from hereon, the space 10 will be referred to as being situated below the control gate layer(s) 4. However, the terms "below," "above," "top," "bottom," "over," "under" and the like in the description and in the claims, if any, are used for descriptive purposes and not necessarily for describing permanent relative positions. It is understood that the terms so used are interchangeable under appropriate circumstances such that the examples described herein are, for example, capable of operation in other orientations than those illustrated or otherwise described herein.

The space 10 may be created in any manner suitable for the specific implementation. For example, as explained below in more detail with reference to FIGS. 2 and 4, one or more sacrificial layers 2 may be present between the control gate layer 4 and the substrate 1. The sacrificial layer 2 may then be removed in the area(s) below the control gate layer 4 where the floating gate structure 120 is to be provided, for example be selective etching or another suitable process. Also, for example, the control gate layer 4 may be partially removed at the side facing the substrate 1 and/or the substrate 1 may be partially removed at the side facing the control gate layer 4 in order to create the space 10.

Figure 1D:
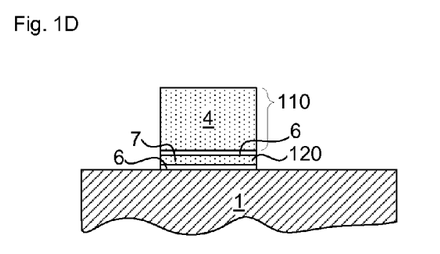

The space 10 may be filled with any material suitable to create a floating gate structure 120 in any manner suitable for the specific implementation. For example, one or more layers 6,7 may be provided in the space 10, as shown in FIG. 1D. Thus, the layer(s) 6,7 can be formed on the layers of the substrate 1 and of the control gate layer 4 and hence, at least partly, from a crystalline base. Accordingly, the formation of the layers 6-7 can be controlled accurately. As shown in FIG. 1D, for example, a stack of layers 6,7 may be provided in the space 10. As explained below in more detail, the stack may include one or more of: a control gate dielectric layer, a floating gate layer, a floating gate dielectric layer.

For example, in the space 10 a conducting layer 7, from hereon referred to as the floating gate layer, may be provided between the control gate layer 4 and the substrate 1. The floating gate layer 7 may for example be formed into the actual floating gate. The floating gate layer 7 may for example be made of polysilicon and for example be formed using vapour deposition or another suitable technique. The floating gate layer 7, such as a layer of polysilicon or a metal, may for example be provided between the dielectric layers 6 on the walls 11,12.

Also, for instance, a top dielectric layer 6 may be provided in the space 10 between the control gate layer 4 and the floating gate layer 7. The top dielectric layer 6, from hereon referred to as the control gate dielectric layer, may electrically insulate the control gate layer 4 from the floating gate layer 7 when no control voltage is applied to the control gate layer 4 but allow charge carriers to pass from or to the floating gate layer 7 if a sufficiently strong control voltage is applied on the control gate layer 4, e.g. by mechanisms such as tunneling or hot carrier injection. Thereby, charge may be stored in the floating gate 120 or be removed from the floating gate 120 when applying a suitable voltage, whereas the charge in the floating gate 120 will remain the same when no voltage is applied to the control gate 110. The control gate dielectric layer 6 may for example be formed between the control gate structure 110 and the floating gate structure 120 by providing a dielectric material on a control gate side wall 11, which defines the space 10 at a control gate side.

Figure 1E:
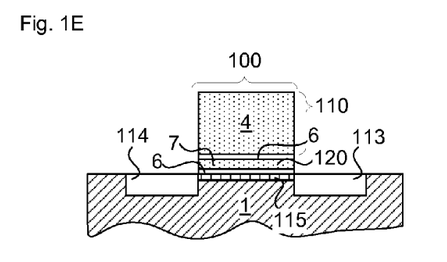

In the space 10, a bottom dielectric layer 6 may for example be provided between the floating gate layer 7 and the substrate 1. A floating gate dielectric 6 which electrically isolates the floating gate structure from the channel of the non-volatile memory device 100 may be formed by providing a dielectric material on the channel side wall 12 of the space 10 which defines the space 10 at a channel side. The floating gate dielectric layer 6 may electrically insulate the floating gate layer 7 from the substrate 1, but enable a capacitive contact between the floating gate layer 7 and the channel 115. Thereby, the voltage in the floating gate layer 7 (caused by the charge present in the floating gate layer 7) can control the flow of charge carriers through the channel 115. As shown in FIG. 1E, below the bottom dielectric layer 6, from hereon referred to as the floating gate dielectric, a channel 115 may be provided which connects a source and drains 113,114. The channel 115 may for example be provided in the substrate 1, e.g. by providing a suitable doping profile, or be provided on top of the substrate 1.

The dielectric layers may be provided in any manner suitable for the specific implementation. For example, as shown in FIG. 1D, walls 11,12 of the space 10 may be provided with a dielectric layer 6. In this example, the walls 11,12 extend parallel to the surface of the substrate, and hence by providing a dielectric layer, the inside of the space 10 (which may further in the process be (partially) filled with the floating gate layer 7) can be electrically respectively insulated from the substrate 1 and the control gate layer 4 in a simple manner. The dielectric layer 6 may for example be a silicon-oxide or a high-k dielectric. The dielectric layer 6 may for example be obtained by oxidization of the walls 11,12 (e.g. when the walls 11,12 are made of (polycrystalline or crystalline)silicon) or by atomic layer deposition (ALD) of the desired dielectric material. The dielectric material may for example be one or more layers of $HfO_2$, $ZrO_2$, $HfZrO_x$, HfSiON, $Ta_2O_5$, $Al_2O_3$ and the like. After formation of the dielectric layer(s), the floating gate layer 7 may be formed. The oxidization may for example be a thermal oxidation of a crystalline silicon.

The formation of the non-volatile memory 100 on the substrate 1 may include forming, from the substrate and the provided layers, one or more floating gate structures 120 and one or more control gate structure 110 in a stacked configuration with one or more of the floating gate structures. As illustrated in FIG. 1E source and drain 113,114 and a channel 115 may also be provided, in order to obtain a non-volatile memory device 100.

The gate structures 110,120 may be formed in any manner suitable for the specific implementation. As illustrated in FIGS. 1A and 1B, for example the control gate layers 4 may be patterned prior to the formation of a space 10 below the control gate layer 4 in order to shape the control gate layer 4 into a control gate structure 110. The control layer 4 may for example be a continuous layer deposited over substantially the whole substrate 1, as shown in FIG. 1A. The continuous layer may be patterned by removing the control gate layer 4 completely outside the areas in which the control gate structure 110 is to be provided, as shown in FIG. 1B. For instance, a patterned protective layer 5, such as a hardmask, may be provided which covers part(s) of a top surface 40. The bare parts of the top surface 40 may then be exposed to a medium suitable to remove the control gate layer 4 but which leaves the material covered by the protective layer 5 intact. The medium may for example be an etchant, e.g. an anisotropic etchant, such as a wet etchant or a dry etchant.

Figure 2A:
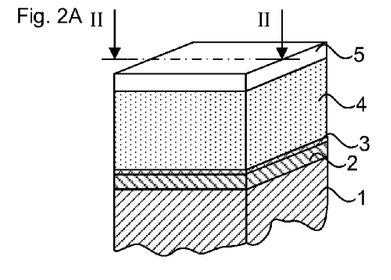
FIGS. 2A-G schematically shows perspective, opened views of a non-volatile memory device in different stages of a second example of a method of manufacturing a non-volatile memory device.
Figure 2B:
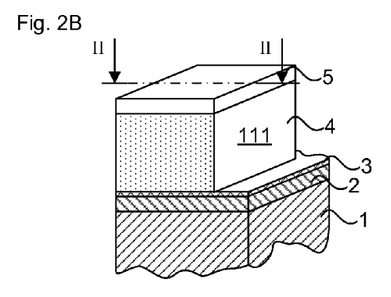
Figure 2C:
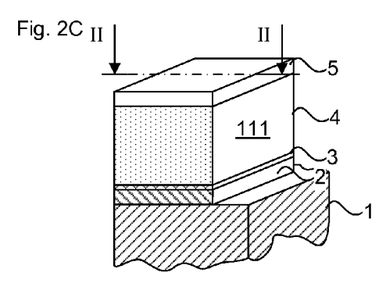

If present, one or more of the intermediate layers 2,3 may be patterned as well, as illustrated in FIG. 2C. The intermediate layers 2,3 may for example be provided with the same pattern as the control gate layer 4, and may be patterned simultaneously with the control gate layer 4. For example, all the intermediate layers 2,3 between the control gate layer 4 and the substrate 1 may be patterned. The intermediate layers 2,3 may for example be completely removed outside the areas where the floating gate structure 120 is to be provided.

As illustrated in FIGS. 1D and 1E, the floating gate structure 120 may for example be formed during the formation of the layer(s) in the space 10. However, it is also possible that the floating gate structure 120 is formed after the desired layers are provided in the space 10. For example, one or more of the layers 6,7 may be a continuous layer which extends outside the space 10 and of which the parts outside the space 10 are removed to form the floating gate structure 120.

In the examples of FIGS. 2A-3G, 5A-E and 6A-E, the figures with index A and B correspond to the phase shown in FIGS. 1A and B, and for sake of brevity are not described in full detail.

As shown in the figures with index A, one or more intermediate layers 2,3 may be present between the substrate 1 and the control gate layer 4. The control layer 4 may for example be provided on a multi-layer structure which includes the substrate 1 and one or more intermediate layers, such as a sacrificial layer 2. In the examples of FIGS. 2-6, the intermediate layers also include a top intermediate layer 3 which separates the sacrificial layer 2 from the control gate layer 4. The sacrificial layer 2 is provided between the substrate 1 and the top intermediate layer 3.

The sacrificial layer 2 and top intermediate layer 3 may for example be crystalline layers grown on a (mono)crystalline substrate 1, for example using epitaxial techniques. The sacrificial layer 2 may for example be a SiGe epitaxial layer grown on a substrate of monocrystalline silicon. The top intermediate layer may for example be a Si or SiGeC (e.g. with a Carbon content between 0.5%-3.0%) layer. For example, the sacrificial layer 2 may be a SiGe layer with a Ge content of 5% to 50%. The sacrificial layer 2 may for example have a thickness of 50 Angstrom or more and/or 500 Angstrom or less A. The top intermediate layer 3 may for example be a silicon epitaxial layer, and for instance have a thickness in the range of 40 Angstrom or more and/or 500 Angstrom or less.

Figure 2D:
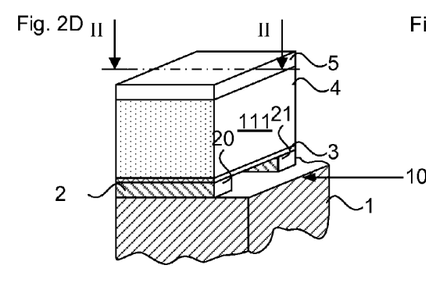
Figure 3A:
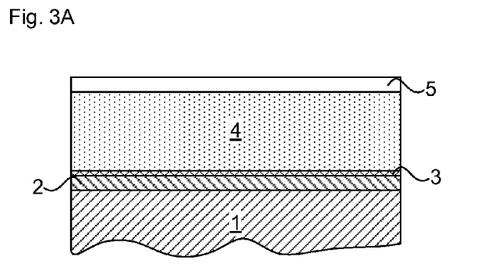
FIGS. 3A-G schematically shows cross-sectional views of the example FIG. 2A-G, taken along the lines II-II in FIG. 2A-G.
Figure 3B:
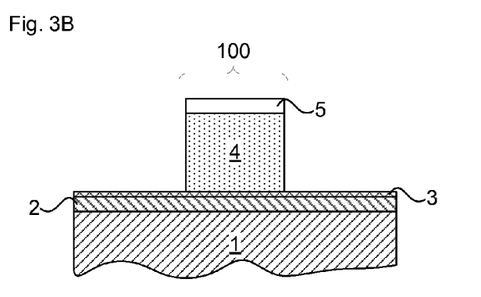
Figure 3C:
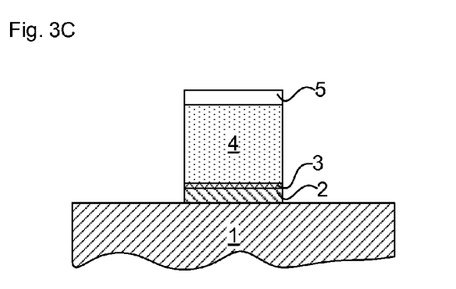
Figure 3D:
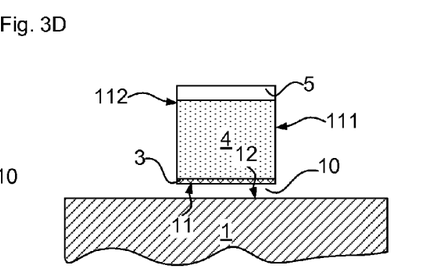

The space 10 may be provided between the control gate layer 4 and the substrate 1 in any layer suitable for the specific implementation. As illustrated in FIG. 2D-3D, 5D, 6D the space 10 may be created below the control gate layer 4, for example by removing the sacrificial layer 2, e.g. by etching with a suitable etchant. As shown in FIGS. 2D and 3D, the removal may be selective to the sacrificial layer 2, i.e. the top intermediate layer 3 and/or the substrate 1 may be left intact. Thereby, the walls 11,12 of the space 10 may be made from mono-crystalline materials and hence layers formed on or from the top intermediate layer 3 and the substrate 1 are formed on or from a mono-crystalline layer and may therefore have a good quality in that a low amount of defects, traps, interface states and scattering centres may be obtained. The sacrificial layer 2 may for example be removed by exposing the layer to an etchant which is selective for the material of the sacrificial layer. The etchant may for example be a chemical dry etchant. A suitable etchant for selectively removing SiGe in a Si/SiGe multilayer has found to be Shibaura CDE-80 manufactured by SHIBAURA, Zama-Shi, Japan. However, other suitable etchants or processes may likewise be used.

The space 10 may for instance be created such that one or more other layers are present between the layer(s) in which the space is provided and the control gate layer 4.

Figure 5A:
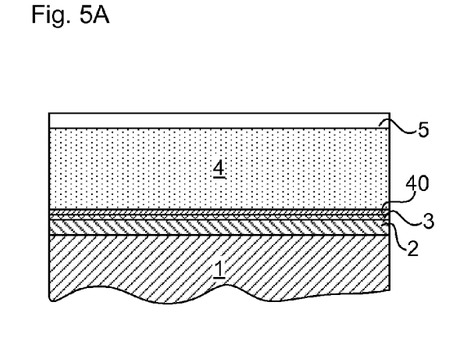
FIGS. 5A-E schematically shows cross-sectional views of a non-volatile memory device in different stages of a fourth example of a method of manufacturing a non-volatile memory device.
Figure 5B:
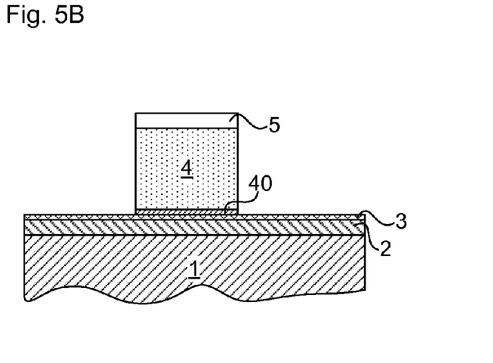
Figure 5C:
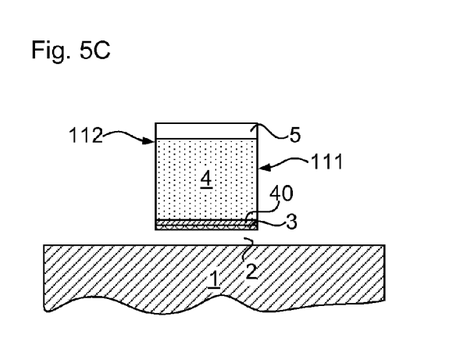
Figure 5D:
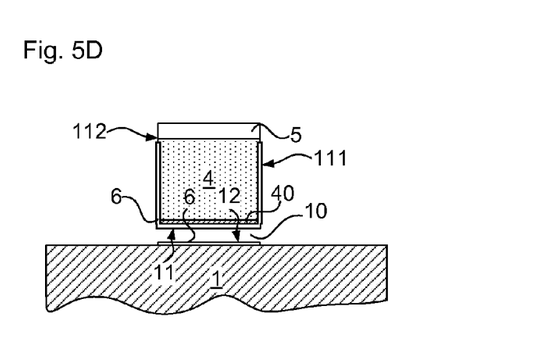
Figure 6A:
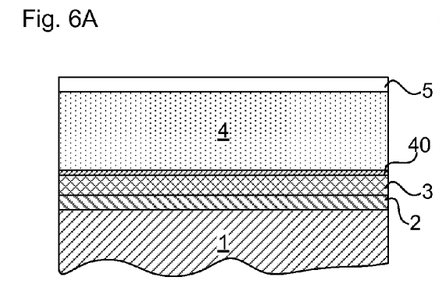
FIGS. 6A-E schematically shows cross-sectional views of a non-volatile memory device in different stages of a fifth example of a method of manufacturing a non-volatile memory device.
Figure 6B:
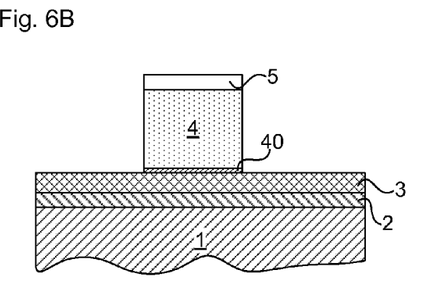
Figure 6C:
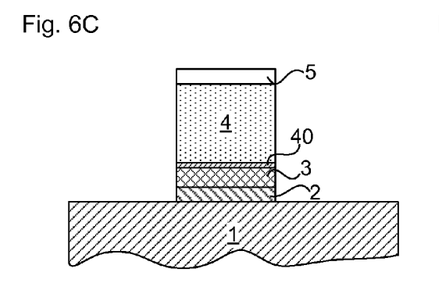

As shown in the example of FIGS. 2D and 3D, for instance, the top intermediate layer 3 may abut to the control gate layer 4 and form the control gate side wall of the space 10. As shown in FIGS. 5C and 6C, for instance, the top intermediate layer 3 may be adjacent, but not abutting, to the control gate layer 4. For example, a dielectric layer 40 may be present between the control gate layer 4 and the top intermediate layer 3 before formation of the space 10. The dielectric layer 40 may for example be made of siliconoxide or other suitable gate dielectric material.

Figure 2E:
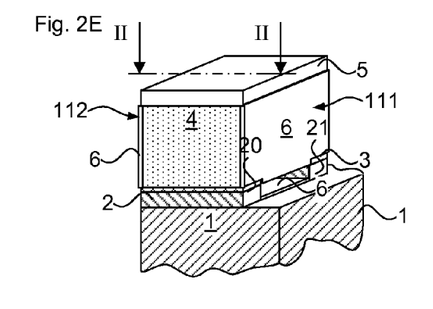
Figure 2F:
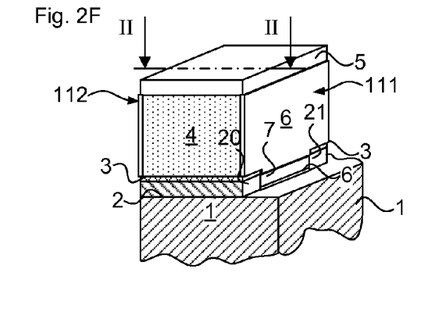
Figure 2G:
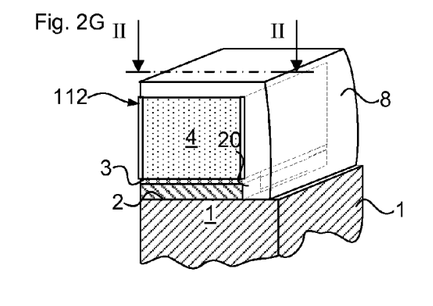

As illustrated in FIGS. 2E and 2F one or more dielectric layers 6 and/or floating gate layers 7 may be provided in the space 10. For example, the layers 6,7 may be provided in an orientation parallel to a longitudinal direction of the space 10. The material layers 6,7 in the space 10 may be provided in any manner suitable for the specific implementation.

Figure 3E:
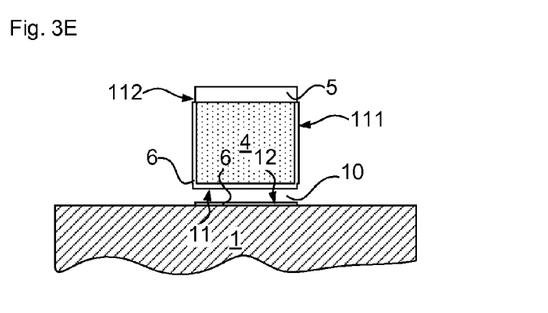
Figure 3F:
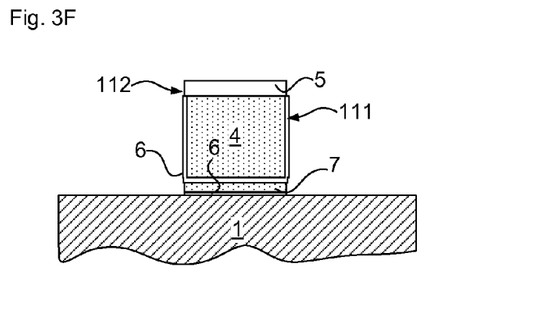
Figure 3G:
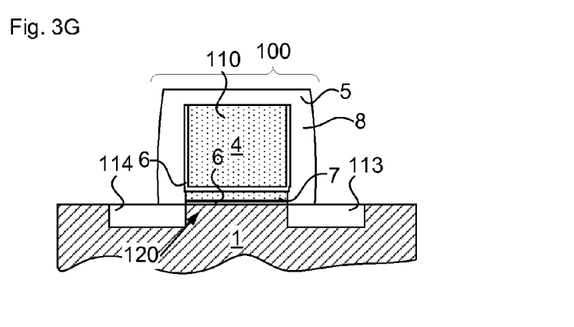

For instance, in the example of FIGS. 2 and 3, the top intermediate layer 3 (which abuts to the control gate layer 4 in this example) may, be provided with or converted into a dielectric layer at the interface with the space 10, as shown in FIGS. 2E and 3E. Thus, the control gate dielectric can be formed.

In case the top intermediate layer 3 (and the substrate 1) are made of silicon, the silicon may for instance be oxidised in order to provide a dielectric layer 6 on the walls 11,12 of the space 10. For instance, as illustrated in FIG. 2E, after providing the space 10, e.g. in this example after etching the sacrificial layer 2, exposed surfaces may be subjected to an oxidation treatment. For example, the walls 11,12 of the space 10 and the side walls 111,112 of the control gate layer 4 may be oxidised. An oxide layer, e.g. siliconoxide, of e.g. about XX micron may be formed on the longitudinal walls of the space 10. In case the substrate 1 and/or the top intermediate layer 3 and/or the control gate structure are made from silicon, the exposed surfaces may be subjected to a dry or wet oxidation. For example, a dry oxidation may be peformed by exposing the surfaces to $O_2$ gas with, optionally admixtures of $N_2$ for dilution and incorporation of nitrogen and/or HCL for enhanced reaction rate. The $O_2$ may be introduced into the chamber at atmospheric pressures at a temperature in the range between 900° C. and 1150° C. A wet oxidation may be for example be employed by exposing the surfaces to water vapour or $H_2$ and $O_2$ at atmospheric pressures As an alternative or in addition to the oxide dielectric, another type of dielectric layer may be formed on the exposed surfaces of the walls 11,12 of the space 10, for example by a suitable chemical reaction of the material of the top and bottom wall 11,12. For example, a high-K dielectric layer may be formed by $HfO_2$, $ZrO_2$, $HfZrO_x$, $Ta_2O_5$, $Al_2O_3$ or other suitable materials. After formation of the dielectric layers 6, a floating gate layer 7 may be provided by Chemical Vapour Deposition (CVD), metal-organic CVD (MOCVD) or by ALD in at least a part of the remaining space 10, as is shown in FIG. 2F. The floating gate layer 7 may, for example, be a layer of polysilicon, SiGe (, for example with a Ge content between 5%-50% in case the SiGe is a a sacrificial layer or between 0% and 100% in case the SiGe is a filling layer. or other suitable gate materials such as metals or silicides: TiN, TaC, TaN, WN, TiN, NiSi, CoSi, PtSi, ErSi or other suitable materials.

Figure 5E:
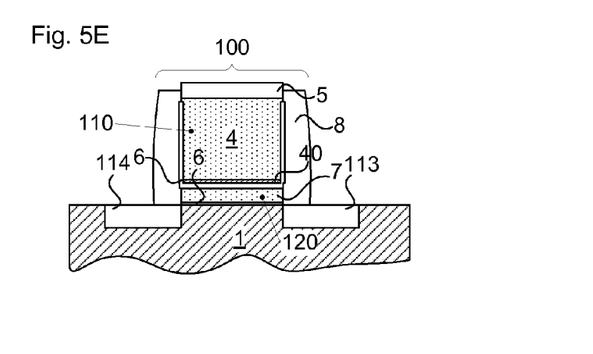

As illustrated in 5D, for example the entire top intermediate layer 3 may be converted into a control gate dielectric, e.g. by oxidization. Thereby, the converted intermediate layer 3 forms the control gate dielectric together with the dielectric layer 40. Accordingly, the dielectric layers 6 may be formed independent from each other, whereas in the example of FIGS. 2A-3G, the dielectric layer separating the floating gate layer 7 from the control gate layer 4 and the dielectric layer separating the floating gate layer 7 from the substrate 1 are created simultaneously. As illustrated in FIG. 5E, the space between the dielectric layers 6 may then be provided with a floating gate layer 7.

Figure 6D:
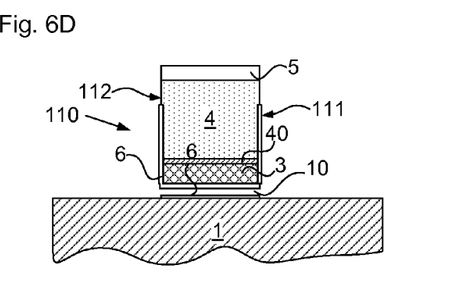
Figure 6E:
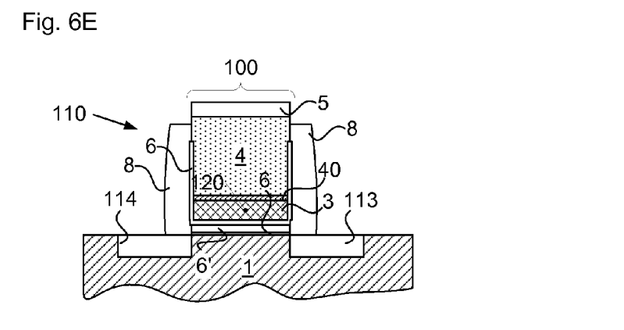

Alternatively, as illustrated in FIG. 6D, the top intermediate layer 3 may only be partially converted or be coated with a dielectric layer. In case the top intermediate layer 3 is a conducting layer (or converted into a conducting layer) and separated from the control gate layer 4 by a dielectric layer 40, the top intermediate layer 3 may form a floating gate layer, and as shown in FIG. 6D be provided at the interface with the space 10 with a dielectric layer 6. The dielectric layer may fill the space 10 or, as shown in FIG. 6D, form a thin layer with a thickness less than the distance between the walls 11,12, after which the space 10 is filled with a dielectric filling material, such as a high-κ dielectric 6', as shown in FIG. 6E. Thereby, a multi-layer floating gate dielectric is obtained. Thereby, the physical thickness of the dielectric layer may be relatively thin while the effective dielectric constant may be relatively high compared to the thickness.

Figure 4:
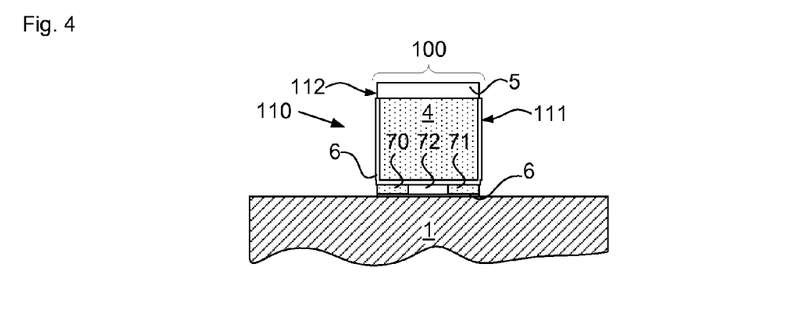
FIG. 4 schematically shows a cross-sectional view of a non-volatile memory device in a stage of a third example of a method of manufacturing a non-volatile memory device.

The space 10 may be filled in any manner suitable for the specific implementation. For example, the space 10 may be partially filled, leaving an non-filled, closed off, cavity 72 in the space 10. Referring to FIG. 4, for example, the space 10 may be filled by introducing a filling material at one or more of the opening(s) of the space 10. The filling material may partially fill the space and close of the openings in regions 70,71, leaving a region 72 in the space 10 which is not filled (but may e.g. be filled with the same medium that surrounds the device 110, such as air or other (mixtures) of gas(ses)). Thus, the floating gate layer 7 may have a different composition in different regions of the space 10, and for example have be conducting in regions 70,71 while electrically insulating in regions 72 which separate the conducting regions 70,71. The conducting regions 70,71 may for example be different charge trapping areas, thus allowing multiple values to be stored in the non-volatile memory device. The region 72 is created by pinching-off the tunnel at both ends by using a high CVD deposition rate. So the space 72 is more or less an air gap.

As illustrated in FIGS. 2G, 3G, 5E, and 6E after the space 10 is filled, the non-volatile memory device 100 may be completed, for example by providing source 113 and drains 114. For instance, source and drain contacts 113,114 may be provided which are connected via a channel 115 and the channel 115 may be capacitive contact with the floating gate structure. Also, an electrically isolating layer 8 may be provided which covers the side walls 111,112 of the stacked configuration. For example spacers 8, for example nitride spacers, or other protective layers may be provided at the side walls of the stacked configuration, in order to protect and/or isolate the non-volatile memory device 100 from, for example, layers provided during further manufacturing.

The outside of the non-volatile memory device 100 may be provided with a protective layer which electrically isolates the non-volatile memory device 100 and protects the non-volatile memory device 100 during further processing of the integrated circuit in which the non-volatile memory device 100 is used.

The created space 10 may have any shape suitable for the specific implementation. As shown in FIGS. 1-6, the space 10 may for example be a passage. The space 10 may for example have a first opening at a first side of the non-volatile memory device and a second opening at a second side of the non-volatile memory device 100. The first side and the second side may for example be a source side an a drain side of the non-volatile memory device respectively.

As shown in the examples, the space 10 may be shaped as a straight tunnel with the openings facing each other. However, the space 10 may alternatively be shaped as a recess with one or more openings at a single side of the non-volatile memory device.

As illustrated more clearly in FIG. 2D, the space 10 may in a direction parallel to the substrate 1 be defined by walls 20,21 which are non-parallel to the substrate 1 and extend between the openings. The walls 20,21 may be formed by remaining parts of the intermediate layers 2,3, in this example by a remaining part of the sacrificial layer 2. The walls 20,21 may mechanically connect the layers above the space 10 to the substrate 1. In this example, for instance, the control gate layer 4 and the top intermediate layer 3 bridge the space 10, and are mechanically connected to the substrate 1 by the walls 20,21.

The space 10 may be defined between the first opening and the second opening in a direction non-parallel to the substrate 1 by a side wall 11 at a control gate side and a side wall 12 at a channel side (at which the channel 115 may be provided). The side walls may for example extend in parallel to the substrate 1. The channel side wall 12 may for example be formed by the substrate 1 while the control gate side wall 11 may be formed by the top intermediate layer 3 or by the control gate layer 4. The control gate side wall 11 may for example be formed by the control gate layer 4 (as shown in FIGS. 2D and 3D), by a dielectric layer (as illustrated in FIG. 4) or by an intermediate layer 3, as is shown in FIG. 6.

Figure 7:
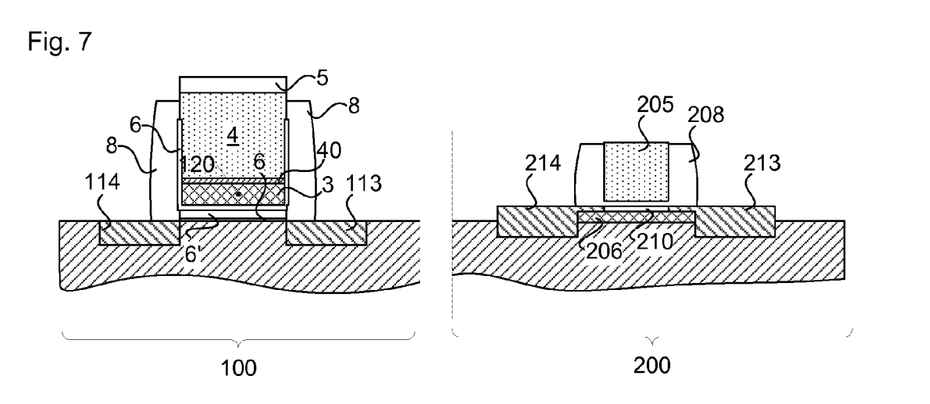
FIG. 7 schematically shows a cross-sectional view of an example of an embodiment of an integrated circuit.

Referring to FIG. 7, before, simultaneously or after the manufacturing of the non-volatile memory 100, logic devices 200 may be formed on the same substrate 1. The formation of the logic devices 200 may include forming a logic gate structure 205, a channel 206 which is in capacitive contact with the logic gate structure. A gate dielectric 210 may be provided between the logic gate structure and the channel 206. The channel 206 may provide a conducting path between terminals 213,214, e.g. between source and drain. The logic device 200 may for example be field effect transistor made with a silicon on nothing (SON) technique. The non-volatile memory 100 and the logic devices 200 may for example, as shown in FIG. 7, be provided as an integrated circuit including a die. The die may include a memory area with at least one non-volatile memory device is proved and a logic area with at least one logic device 200.

In the foregoing specification, the invention has been described with reference to specific examples. It will, however, be evident that various modifications and changes may be made therein without departing from the broader spirit and scope of the invention as set forth in the appended claims.

Also, for example, the substrate 1 may be a Silicon on Insulator wafer (SOI), SiGe on Insulator wafer, or Ge on Insulator (GOI) wader and/or be made on any suitable material, such as Si, SiGe, SiC or other suitable conducting, semiconducting or insulating materials. Furthermore, although in the examples only a single memory device 100 is shown, it will be apparent that a multiple of memory devices may be manufactured on the same substrate, for example to manufacture a flash memory, and that in addition to memory devices other components, such as a logic circuit may be manufactured on the same substrate.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A method of manufacturing a non-volatile memory device, comprising:
   providing at least one control gate layer on a substrate;
   creating a passage between said at least one control gate layer and said substrate, said passage extending from a first opening at a drain location of the non-volatile memory device to a second opening at a source location of the non-volatile memory device;

providing in said passage at least one filling layer; and forming a floating gate structure including said filling layer and forming a control gate structure including said at least one control gate layer, said control gate structure being in a stacked configuration with said floating gate structure.

2. A method as claimed in claim 1, wherein said passage is created between said substrate and a dielectric layer, said dielectric layer being positioned between said substrate and said control gate layer.

3. A method as claimed in claim 2, wherein said passage is created between said substrate and an electrically conducting layer, which electrically conducting layer is positioned between said dielectric layer and said substrate; and wherein said providing in said passage at least one filling layer comprises includes:

providing at least one dielectric layer which separates said electrically conducting layer from a channel of the non-volatile memory device.

4. A method as claimed in claim 3, comprising providing in said passage at least one dielectric layer which separates a floating gate layer from said at least one control gate layer.

5. A method as claimed in claim 2, comprising providing in said passage at least one dielectric layer which separates a floating gate layer from said at least one control gate layer.

6. A method as claimed in claim 2, wherein said providing in said passage at least one filling layer comprises:

providing in said passage at least one floating gate dielectric layer; and providing in said passage at least one floating gate layer.

7. A method as claimed in claim 2, wherein at least one filling layer in a first region is formed of a first material and in a second region is formed of a second material different from the first material.

8. A method as claimed in claim 1, comprising providing in said passage at least one dielectric layer which separates a floating gate layer from said at least one control gate layer.

9. A method as claimed in claim 1, wherein said providing in said passage at least one filling layer comprises:

providing in said passage at least one floating gate dielectric layer; and providing in said passage at least one floating gate layer.

10. A method as claimed in claim 1, wherein at least one filling layer in a first region is formed of a first material and in a second region is formed of a second material different from the first material.

11. A method as claimed in claim 10, wherein said first region comprises:

a first gate region of a conducting material, for forming a first floating gate and a second gate region of a conducting material, for forming a second floating gate, and said second region includes a dielectric region of a dielectric material which separates said first gate region from said second gate region.

12. A method as claimed in claim 11, wherein said dielectric material is a gas or mixture of gasses, such as air.

13. A method as claimed in claim 1, wherein:

said passage is at least defined by a control gate side wall and a channel side wall facing the control gate side wall, and said providing in said passage at least one filling layer comprises:

providing a dielectric layer on at least one of said control gate side wall and said channel side wall.

14. A method as claimed in claim 1, wherein said channel side wall is formed by a substrate layer.

15. A method as claimed in claim 1, wherein said at least one control gate layer is provided on at least one intermediate layer which separates the control gate layer from a substrate.

16. A method as claimed in claim 15, wherein said at least one intermediate layer includes at least one sacrificial layer, and wherein said creating said passage includes removing said sacrificial layer where desired.

17. A method as claimed in claim 15, wherein said at least one intermediate layer and/or said filling layer include one of more of the group consisting of: SiGe layer, Si layer, SiGeC layer, epitaxial layer, polycrystalline layer, crystalline layer.

18. The method of claim 1, wherein said passage is positioned such that said passage is surrounded on at least two sides by the same material.

19. A non-volatile memory device comprising:

at least one control gate layer on a substrate;

a passage between said at least one control gate layer and said substrate, said passage extending from a first opening at a drain location of the non-volatile memory device to a second opening at a source location of the non-volatile memory device, in which said passage includes at least one filling layer; and a floating gate structure including said filling layer and a control gate structure including said at least one control gate layer, said control gate structure being in a stacked configuration with said floating gate structure.

20. An integrated circuit including a die comprising:

a memory area with at least one non-volatile memory device as claimed in claim 19; and a logic area with at least one logic device.

* * * * *